United States Patent [19]
Gotoh et al.

[11] Patent Number: 6,160,322
[45] Date of Patent: Dec. 12, 2000

[54] PULSE SIGNAL GENERATION METHOD AND APPARATUS

[75] Inventors: Akihiro Gotoh; Shoji Oyama; Tomoaki Ito, all of Tokyo, Japan

[73] Assignee: Hirose Electric Co., Ltd., Tokyo, Japan

[21] Appl. No.: 09/150,620

[22] Filed: Sep. 10, 1998

[30] Foreign Application Priority Data

Sep. 17, 1997 [JP] Japan ................................. 9-251540

[51] Int. Cl.⁷ ........................................... G01B 7/24
[52] U.S. Cl. .................... 307/106; 307/652; 327/510; 361/179
[58] Field of Search .................... 307/106, 104, 307/652; 327/510, 517; 361/179, 180; 73/728, 862.336, 862.332; 336/20; 324/209

[56] References Cited

U.S. PATENT DOCUMENTS

| | | | |
|---|---|---|---|
| 4,226,126 | 10/1980 | Herden | 73/728 |
| 4,263,525 | 4/1981 | Lathlaen . | |
| 4,523,482 | 6/1985 | Bakhoudarian | 73/862.336 |
| 4,596,150 | 6/1986 | Kuhr | 324/209 |
| 4,931,730 | 6/1990 | Olsen et al. | 324/209 |
| 5,128,614 | 7/1992 | Schewe . | |
| 5,565,773 | 10/1996 | Inaguma et al. | 324/209 |

FOREIGN PATENT DOCUMENTS

| | | |
|---|---|---|
| 0448114 | 9/1991 | European Pat. Off. . |
| 2530036 | 1/1984 | France . |
| 54-161257 | 12/1979 | Japan . |
| 2-284082 | 11/1990 | Japan . |
| 4-218905 | 8/1992 | Japan . |

Primary Examiner—Albert W. Paladini
Attorney, Agent, or Firm—Kanesaka & Takeuchi

[57] ABSTRACT

A pulse signal generator comprises a magnetic element capable of causing a large Barkhausen jump, a detector provided in relation to the magnetic element, a magnetic field source provided in the vicinity of the magnetic element to produce a biasing magnetic field which causes a predetermined magnetization of the magnetic element, and a magnetic circuit forming member provided in the vicinity of the magnetic element to produce a main magnetic field which cause a large Barkhausen jump in the magnetic element such that movement of the object to be detected changes the main magnetic field of the magnetic circuit forming member thereby causing a large Barkhausen jump to provide a pulse signal.

15 Claims, 6 Drawing Sheets

PULSE SIGNAL GENERATION METHOD AND APPARATUS

BACKGROUND OF THE INVENTION

1. Filed of the Invention

The present invention relates to a method and apparatus for generating a pulse signal.

2. Description of the Related Art

It is necessary to provide a pulse signal in response to the position or speed of a moving object in the field of automatic control or electric or electronic equipment. An electromagnetic pickup is an example of such pulse generators. This electromagnetic pickup comprises a magnetic body, a magnet, and an electrical coil. The magnetic flux varies with movement of the object to be detected to produce a voltage in the electrical coil by the electromagnetic induction. The voltage is used as a pulse signal.

However, the electromagnetic pickup is not suitable in the following field. That is, if the object to be detected moves at very low speeds, the produced voltage is as low as the noise level. If an amplifier is used, the noise is also amplified so that it is necessary to use a filter for removing the noise prior to the amplification. Conversely, the object moves at high speeds, the resulting voltage exceeds the breakdown voltage of the amplifier, thus requiring a limiter. In the case of low speeds, an auxiliary ring is attached to the object to be detected to increase the diameter and thus the peripheral speed. However, this method increases the number of parts and the size of the device. In addition, the timing of rise or fall of the voltage varies with the moving speed of the object to be detected, requiring a complicated signal processor to provide an accurate timing detection. Moreover, the waveform of the voltage varies with the shape of the object to be detected.

Another example is a Hall effect sensor used as a position sensor, angular sensor, or speed sensor. Japanese patent application Kokai No. 2-284082 discloses a Hall effect sensor. This Hall effect sensor comprises a Hall element and a magnet for changing the magnetic flux to the Hall element in response to movement of the object to be detected to provide an electrical signal from the Hall element. However, this type of sensor needs a power source to energize the Hall element. The output electrical signal is a sine wave and cannot produce a sharp pulse signal. If the object to be detected moves at low speeds, the rise of an output voltage is so low that the waveform is truncated. Like the above electromagnetic pickup, it is prone to an external magnetic field and noise and suffers from thermal drift, requiring a complicated processor to provide an accurate detection signal.

Japanese patent application Kokai No. 54-161257 discloses still another type of pulse signal generator. This pulse signal generator comprises a magnetism sensitive element made from a ferromagnetic material so as to have relatively soft and hard portions of magnetic anisotropy, a first magnetic field source for magnetizing the magnetism sensitive element in a positive direction, a second magnetic field source for magnetizing the soft portion of the magnetism sensitive element in a negative direction, a detection coil provided in vicinity of the magnetism sensitive element, and a movable body for interrupting the magnetization of the magnetism sensitive element by the first magnetic field source so that a pulse voltage is produced in the detection coil by the movement of the movable body.

This pulse signal generator is of the powerless type, provides a constant pulse voltage even if the movable object moves at very low speeds, and is resistant against an external magnetic field, thus solving some of the problems of the electromagnetic pickup and Hall effect sensor.

However, this pulse signal generator has the following problems and stands far from practical use. First of all, it needs a movable body with a slit. This movable body cannot be made smaller than the magnet, such as first and second magnetic field sources, and the magnetism sensitive element. Since the slits are provided in the movable body in radial directions, it is necessary to provide a movable body of a large diameter in order to increase the resolution. In addition, the movable body, the magnet, and the magnetism sensitive element should be parallel to each other. The magnet is prone to an external magnetic field or metal to become unstable in operation. It cannot replace the electromagnetic pickup or Hall effect sensor depending on the spacial relationship with the object to be detected. For example, it cannot be disposed to detect directly the teeth of a gear.

SUMMARY OF THE INVENTION

Accordingly, it is an object of the invention to provide a pulse signal generator which solves such problems as described above and are used for more applications than before.

According to one aspect of the invention there is provided a method for producing a pulse signal with a magnetic element capable of causing a large Barkhausen jump, comprises the steps of applying a magnetic field for effecting a predetermined magnetization of the magnetic element and providing a magnetic circuit forming member capable of forming a magnetic circuit via an object to be detected to thereby change the magnetic field upon the magnetic element in response to movement of the object to be detected thereby causing a large Barkhausen jump in the magnetic element to provide a pulse signal.

According to another aspect of the invention there is provided a method for generating a pulse signal with a magnetic element capable of causing a large Barkhausen jump, comprising the steps of:

applying to said magnetic element a magnetic field for causing a predetermined magnetization of said magnetic element; and providing a magnetic circuit forming member stationary with respect to said magnetic element for changing said magnetic field upon said magnetic element according to movement of said object, thereby causing a large Barkhausen jump in said magnetic element to provide a pulse signal.

According to still another aspect of the invention there is provided a pulse signal generator, comprising a magnetic element capable of causing a large Barkhausen jump; a detector provided in relation with said magnetic element; a magnetic field source provided in vicinity of said magnetic element for applying a biasing magnetic field which causes a predetermined magnetization of said magnetic element; a magnetic circuit forming member provided in vicinity of said magnetic element for providing a main magnetic field which causes a large Barkhausen jump in said magnetic element; said magnetic circuit forming member forming a magnetic circuit via an object to be detected and changing said main magnetic field to producing a large Barkhausen jump in said magnetic element.

According to yet another aspect of the invention there is provided a pulse signal generator, comprising a magnetic element capable of causing a large Barkhausen jump; a detector provided in relation with said magnetic element; a magnetic field generator provided in vicinity of said magnetic element for applying a biasing magnetic field which causes a predetermined magnetization of said magnetic element; a magnetic circuit forming member provided in vicinity of said magnetic element for producing a main magnetic field which causes a large Barkhausen jump in said magnetic element; said magnetic circuit forming member provided in a stationary state with respect to said magnetic element and having a magnetic path with its reluctance changed by an object to be detected and changing said main magnetic field according to changes in said reluctance to producing a large Barkhausen jump in said magnetic element.

According to an embodiment of the invention, said magnetic field generating means is a magnet having magnetic poles in vicinity of opposite ends of said magnetic element.

According to another embodiment of the invention, said magnetic circuit forming means comprises a magnet and a magnetic member such that a space is provided between a magnetic pole of said magnet and an end of said magnetic member to accommodate said object to be detected.

According to still another embodiment of the invention, said magnetic circuit forming means comprises a magnet and a magnetic member having a space for accommodating said object to be detected.

According to yet another embodiment of the invention, said magnetic circuit forming means is made such that said magnetic element is in a magnetic circuit via said object to be detected.

According to another embodiment of the invention, said magnetic circuit forming means comprises a magnet with a pair of magnetic poles between which there is provided a space for accommodating said object to be detected.

According to still another embodiment of the invention, said magnetic element is a wire-type element.

According to yet another embodiment of the invention, said detector comprises a detection coil provided around said magnetic element.

According to another embodiment of the invention, said magnetic element is a film-like element.

According to still another embodiment of the invention, said magnetic element is a plate-like element.

According to yet another embodiment of the invention, said detector comprises a flat detection coil provided in vicinity of said magnetic element.

DESCRIPTION OF THE PREFERRED EMBODIMENTS

Before embodiments are described, the "magnetic element capable of causing a large Barkhausen jump" will be described. First of all, the structure and function of a wire-type composite magnetic element will be described. When a ferromagnetic body is drawn to form a wire, the wire has characteristic magnetic properties depending on the alloy composition. When the ferromagnetic wire is twisted, the peripheral and central regions have different magnetic properties because of different amounts of twist. Then, the wire is treated to provide a ferromagnetic wire which retains the magnetic properties. The magnetic direction of the peripheral region is changed by a weak magnetic field while the magnetic direction of the central region is changed by a magnetic field which is stronger than the magnetic field for the peripheral region. That is, the composite magnetic body has two kinds of magnetic regions; one which is magnetized easily and the other which is difficult to be magnetized. This composite magnetic wire is uniaxis anisotropic. The peripheral and central regions are called "soft" and "hard" layers, respectively, and the composite magnetic wire is called "wire-type composite magnetic element."

The magnetic directions of the hard and soft layers are not determined initially. When an external field which is sufficiently strong to invert the magnetic direction of the hard layer is applied to the composite magnetic wire in the axial direction, both the soft and hard layers are magnetized in the same magnetic direction. Then, an external magnetic field which is sufficiently strong to magnetize only the soft layer is applied in the direction opposite to the previous direction. Consequently, the soft and hard layers are magnetized in opposite directions. Since the element is uniaxial anisotropic, when the external field is removed, the magnetic direction of the soft layer remains stable under the influence of the hard layer. This external magnetic field is called "set magnetic field." Then, an external field which is opposite in direction is applied to increase the magnetic field. When the external magnetic field exceeds the critical strength, the magnetic direction of the soft layer is inverted abruptly. This magnetic field is called "critical magnetic field." The inversion phenomenon occurs instantly as the magnetic wall of the soft layer moves like avalanche. Consequently, the magnetic directions of the soft and hard layers are the same as the original state. This external magnetic field is stronger than the critical magnetic field and called "reset magnetic field." This avalanche phenomenon is called "large Barkhausen jump." The speed of the magnetic inversion depends on only the large Barkhausen jump and is irrelevant to the external magnetic field.

Beside the wire-type magnetic element, a variety of other magnetic elements which show the same properties may be used for the invention. A magnetic element which has no composite layers, such as hard and soft layers, may cause a large Barkhausen jump, too. For example, a thin film making technique such as disclosed in Japanese patent application Kokai No. 4-218905 is used to form a thin-film magnetic body. The magnetic elements may be of the thick films or plates. Thus, the "magnetic elements capable of causing large Barkhausen jump" include all the magnetic elements which show the above characteristics.

Figure 1:
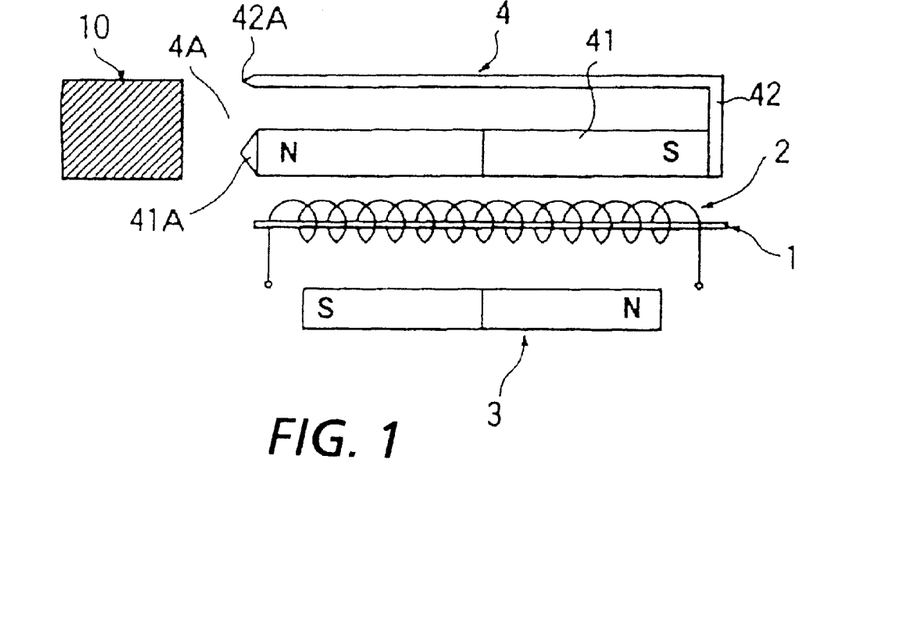
FIG. 1 is a schematic diagram showing a pulse signal generator according to an embodiment of the invention.

An embodiment of the invention will now be described. In FIG. 1, a pulse signal generator comprises a wire-type magnetic element 1, a detection coil 2 wound around the composite magnetic element 1, a bar-like biasing permanent magnet 3 disposed in the vicinity of the magnetic element 1 to produce a biasing magnetic field capable of magnetizing in a predetermined direction the soft layer of the magnetic element 1, and a magnetic circuit forming member 4 disposed in the vicinity of the magnetic element 1 in a stable relation to the magnetic element 1.

The magnetic circuit forming member 4 consists of a bar-like permanent magnet (main magnet) 41 which has poles opposite to those of the permanent magnet 3 and a magnetic member 42 made from a magnetic material which is attached to an end of the permanent magnet 41 and bent into parallel to the permanent magnet 41. The other end 41A of the permanent magnet 41 and a free end of the magnetic member 42 produce a magnetic path 4A between them, the magnetic resistance (reluctance) of which is changed by the body to be detected 10.

The operation of the pulse signal generator will be described. The body to be detected 10 is a tooth of a gear, for example. When the gear tooth 10 is in the vicinity of the magnetic path 4A between the ends 41A and 42A of the percent magnets 41 and 42, the magnetic field of the permanent magnet 3 is dominant with respect to the magnetic element 1 and magnetizes only the soft layer of the magnetic element 1 in the direction opposite to the hard layer. When the gear tooth 10 is not in the vicinity of the magnetic path 4A, the magnetic field of the permanent magnet 41 is dominant with respect to the magnetic element 1 so that the magnetic field applied to the magnetic element 1 is inverted so as to align the magnetic directions of the hard and soft layers of the magnetic element 1.

Figure 2:
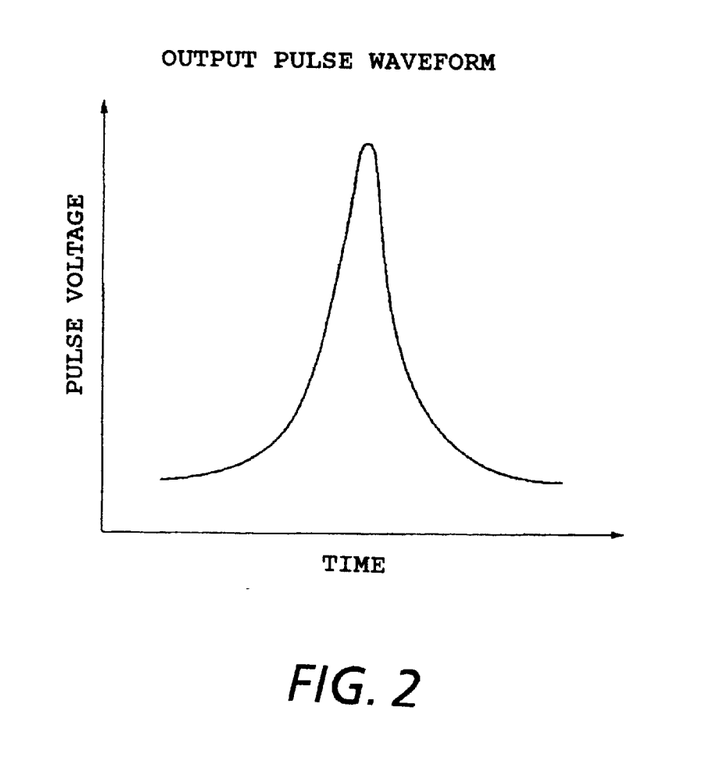
FIG. 2 is a graph showing the waveform of a pulse voltage generated by the pulse signal generator.

In this way, the magnetic flux from the permanent magnet 41 concentrates on the detection area or the magnetic path 4A. Consequently, when the gear tooth 10 comes to the detection area 4A, the magnetic field (main field) of the permanent magnet 41 upon the magnetic element 1 is changed. That is, the gear tooth 10 reduces the magnetic resistance (reluctance) of the magnetic path 4A so that the magnetic flux from the permanent magnet 41 concentrates on the magnetic path 4A. Consequently, the external field of the permanent magnet 41 upon the magnetic element 1 is weaker than before. As a result, the magnetic field of the permanent magnet 3 is dominant so that the soft layer of the magnetic element 1 is magnetized in the direction opposite to that of the hard layer, establishing the set state. When the gear tooth 10 moves away from the detection area 4A, the magnetic resistance (reluctance) of the magnetic path 4A becomes high, so that the magnetic flux from the permanent magnet 41 does not concentrate on the magnetic path 4A. Consequently, the external field of the permanent magnet 41 upon the magnetic element 1 becomes high, thus the magnetic field is inverted. For this reason, the magnetic field in the same direction as that of the hard layer is applied. When it exceeds the critical strength, the large Barkhausen jump takes place. Since the magnetic field of the soft layer changes at a very high speed, a pulse voltage is generated in the detection coil 2 by the electromagnetic induction. The waveform of the pulse voltage is shown in FIG. 2. The magnetic circuit forming member 4 converts the change of the gear rotation speed to the change of magnetic state of the magnetic element 1 by the permanent magnet 41.

Figure 3:
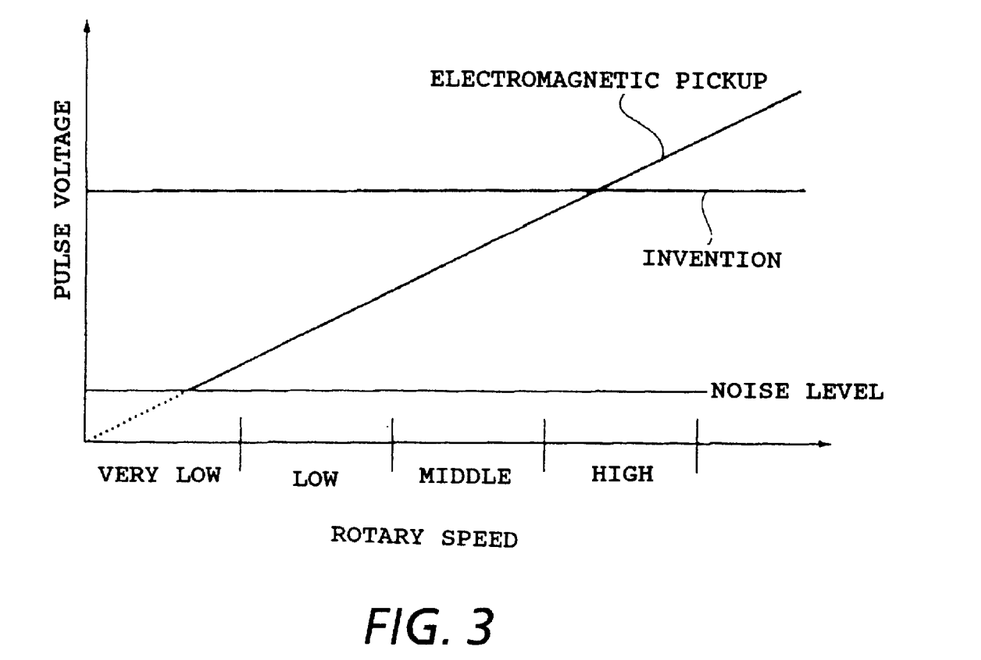
FIG. 3 is a graph showing a comparison between the pulse voltage of the invention and the pulse voltage of the electromagnetic pickup.

The change of magnetic state by the large Barkhausen jump in the magnetic element 1 is detected by the detection coil 2 as a pulse voltage by the electromagnetic induction. The presence or absence of the gear tooth causes the large Barkhausen jump in the magnetic element 1 and generates a pulse signal. Thus, even if the object to be detected moves slowly, it is possible to make detection. The pulse voltage keeps a constant voltage and phase relationship. A comparison between the pulse voltage according to the invention and the pulse voltage by the conventional electromagnetic pickup is shown in FIG. 3. The amplitude of the pulse voltage by the conventional electromagnetic pickup varies with the speed of the object to be detected. When the object moves at very low speeds, the pulse voltage can be below the noise level, whereas the amplitude of the pulse voltage by the invention keeps a predetermined level regardless of the speed of the object to be detected.

According to the invention, by adjusting the size of the detection area 4A of the magnetic circuit forming member 4 it is possible to provide very high resolution. For example, by matching the distance between the ends 41A ad 42A of the permanent magnet 41 and the magnetic member 42 with the size and pitch of the gear tooth 10, it is possible to increase the resolution.

If the object to be detected is made from a magnetic material, such as a permanent magnet or those able to be magnetized, it is not necessary to provide a separate movable body.

Figure 4:
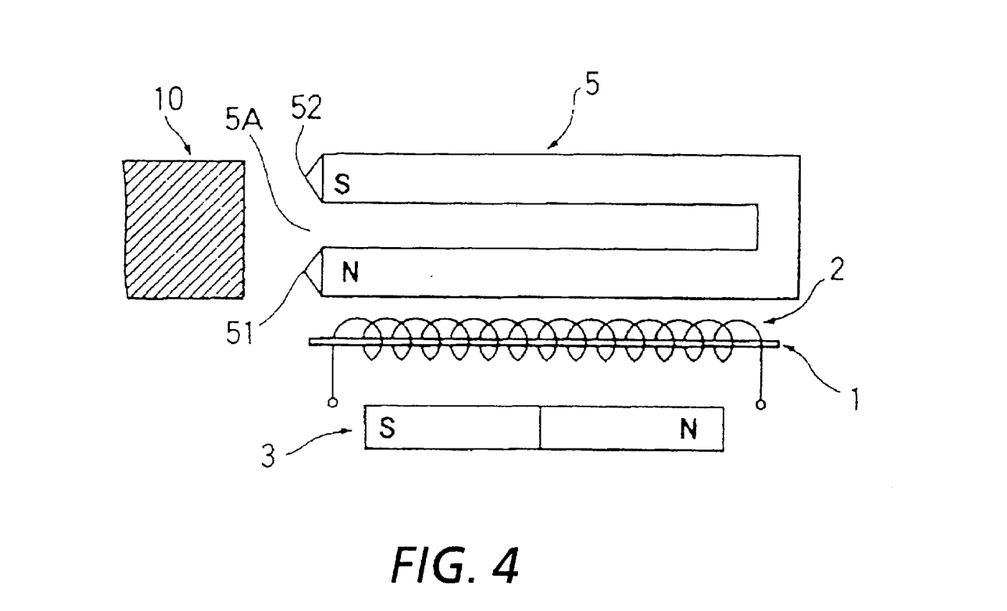
FIG. 4 is a schematic diagram showing a pulse signal generator according to another embodiment of the invention.

FIG. 4 shows another embodiment of the invention.

A pulse signal generator is identical with that of FIG. 1 except for the magnetic circuit forming member. A magnetic circuit forming member 5 consists of a C-shaped permanent magnet. The N pole 51 of the permanent magnet 5 is provided in the vicinity of the magnetic element 1, and the detection area is a magnetic path 5A between the S and N pole end portions 52 and 51.

The operation of the pulse signal generator of FIG. 4 is the same as that of FIG. 1 and the description is omitted.

Figure 5:
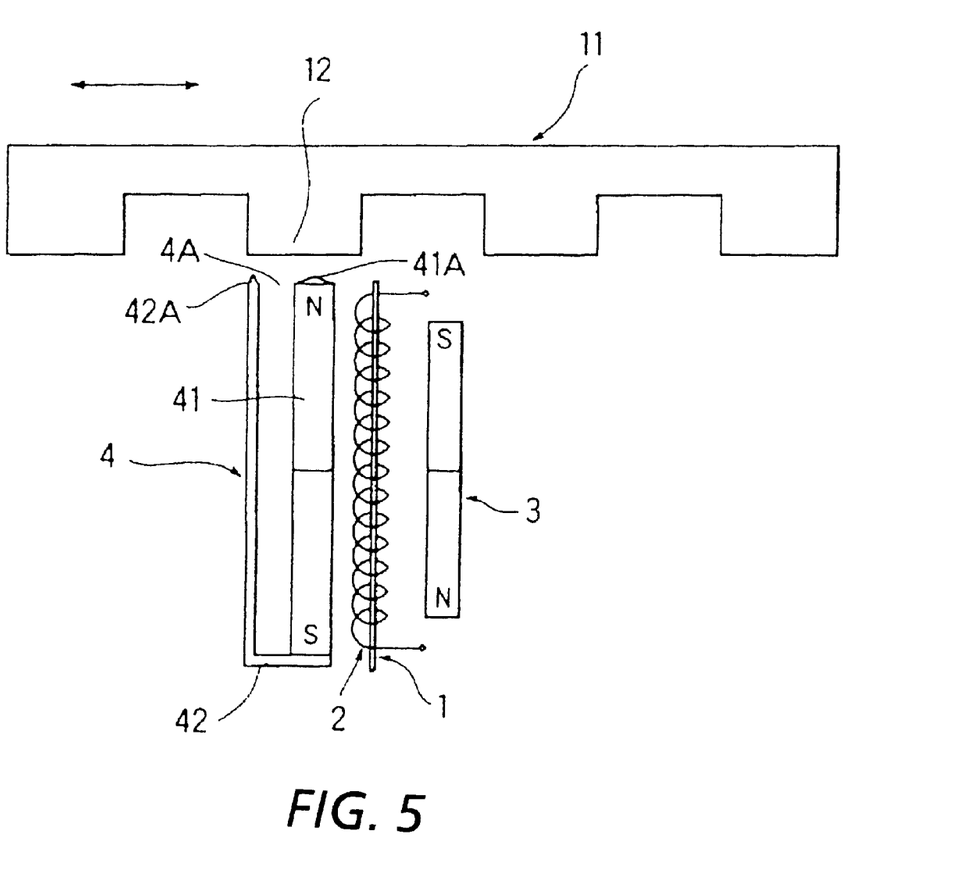
FIG. 5 is a schematic diagram showing an application of the pulse signal generator of FIG. 1.

The uses of the pulse signal generator will be described with reference to FIGS. 5–7. In FIG. 5, the pulse signal generator of FIG. 1 is used to detect the teeth 12 of a rack gear 11 which is made from a magnetic material and moves in straight in the direction of an arrow. Every time the tooth 12 passes the detection area 4A of the pulse signal generator, a pulse voltage is generated in the detection coil 2. By processing the pulse signal, it is possible to determine the speed and position of the rack gear 11.

Figure 6:
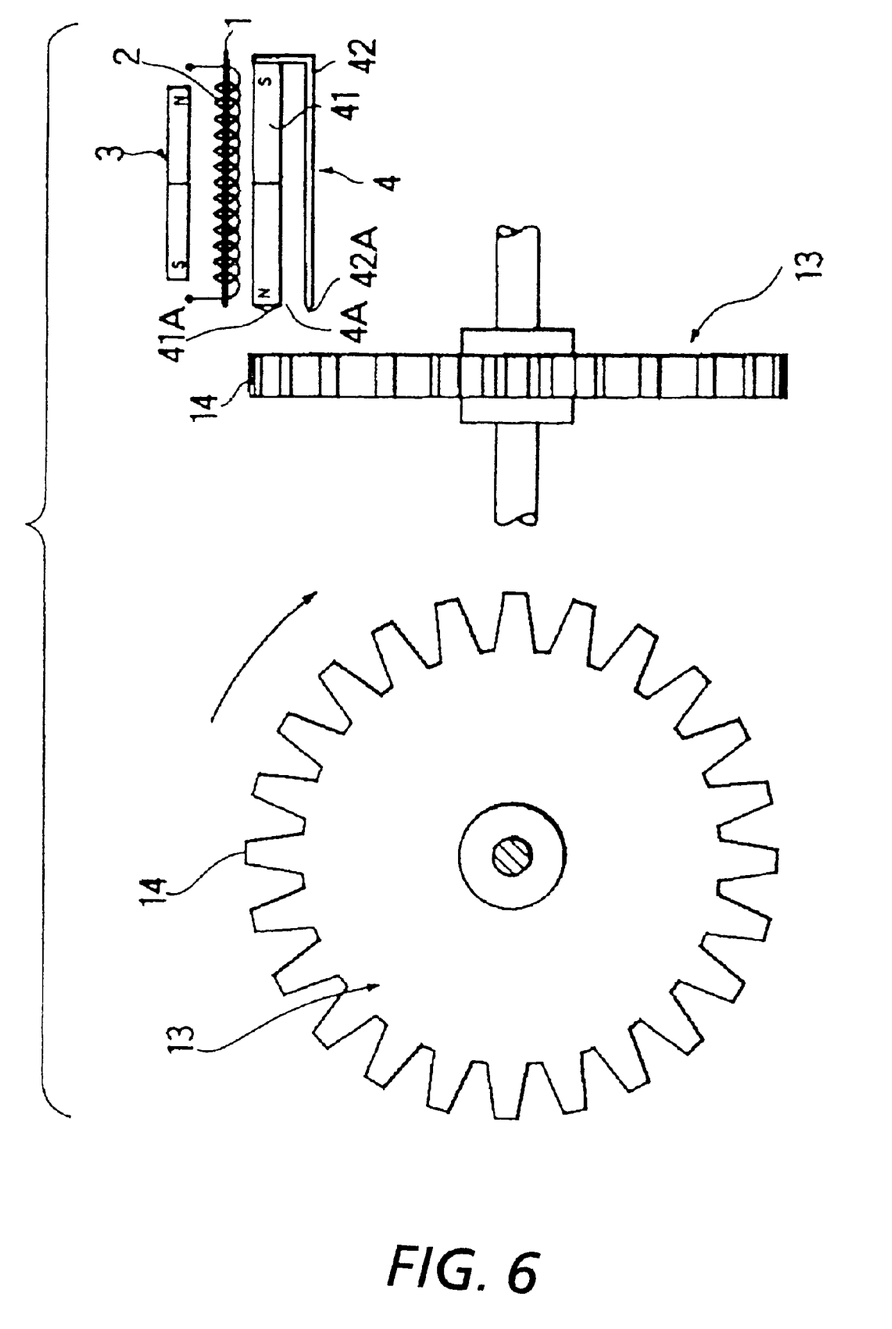
FIG. 6 is a schematic diagram showing another application of the pulse signal generator of FIG. 1.

In FIG. 6, the pulse signal generator is used to detect the teeth 14 of a rotary gear 13 which is made from a magnetic material and rotates in the direction of an arrow. Every time the side face of a tooth 14 passes the detection area 4A of the pulse signal generator, a pulse voltage is generated in the detection coil 2. By processing the pulse signal, it is possible to determine the rotary speed and position of the rotary gear 13.

Figure 7:
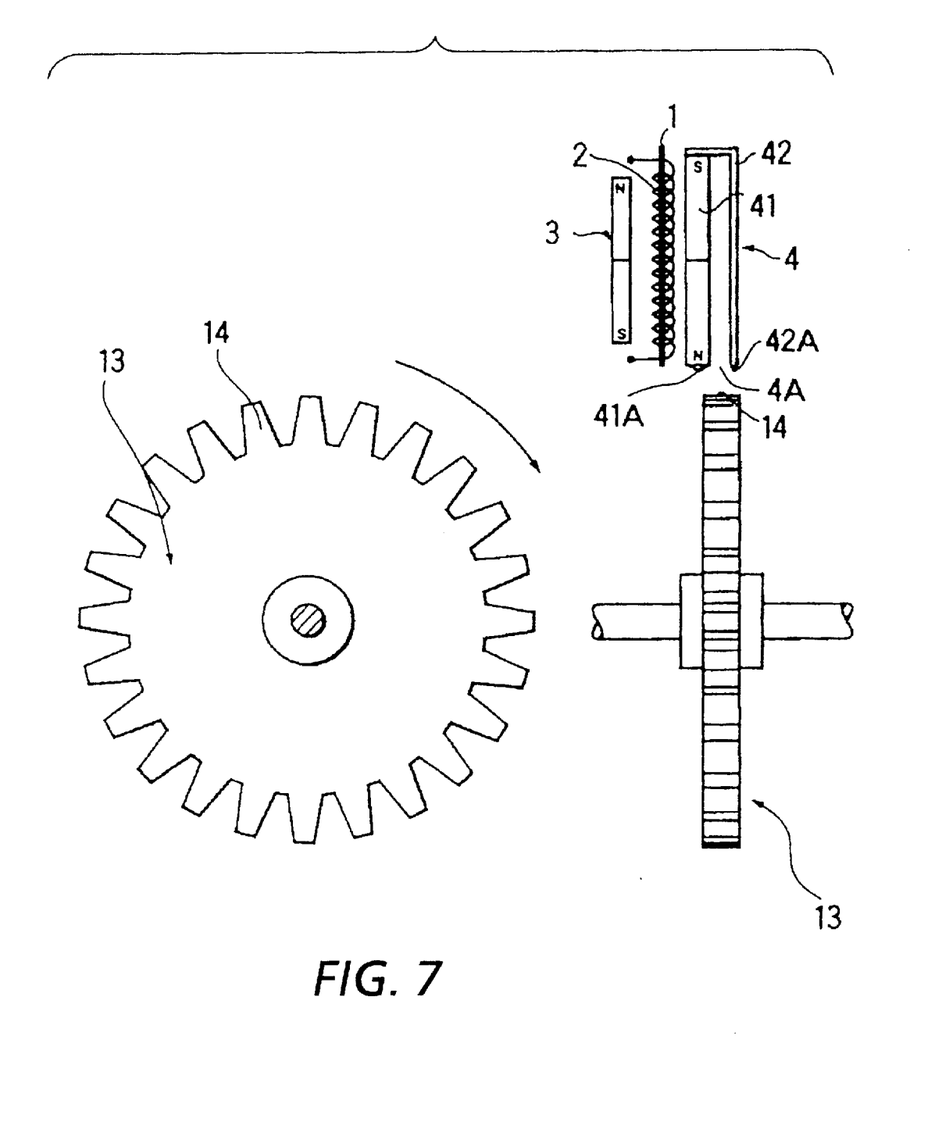
FIG. 7 is a schematic diagram showing still another application of the pulse signal generator of FIG. 1.

In FIG. 7, the pulse signal generator is used to detect the teeth 14 of a rotary gear 13 which is made from a magnetic material and rotates in the direction of an arrow. Every time the tooth 14 passes the detection area 4A, a pulse voltage is generated in the detection coil 2. By processing the pulse signal, it is possible to determine the rotary speed and position of the rotary gear 13.

In the above examples, the wire-type magnetic element 1 is used but, as described above, a variety of other magnetic elements, such as thin-film, thick-film, or magnetic plate, may be used. In these cases, the detection coil 2 may be made as a flat coil. The magnetic element may be a single layer magnetic element.

Figure 8:
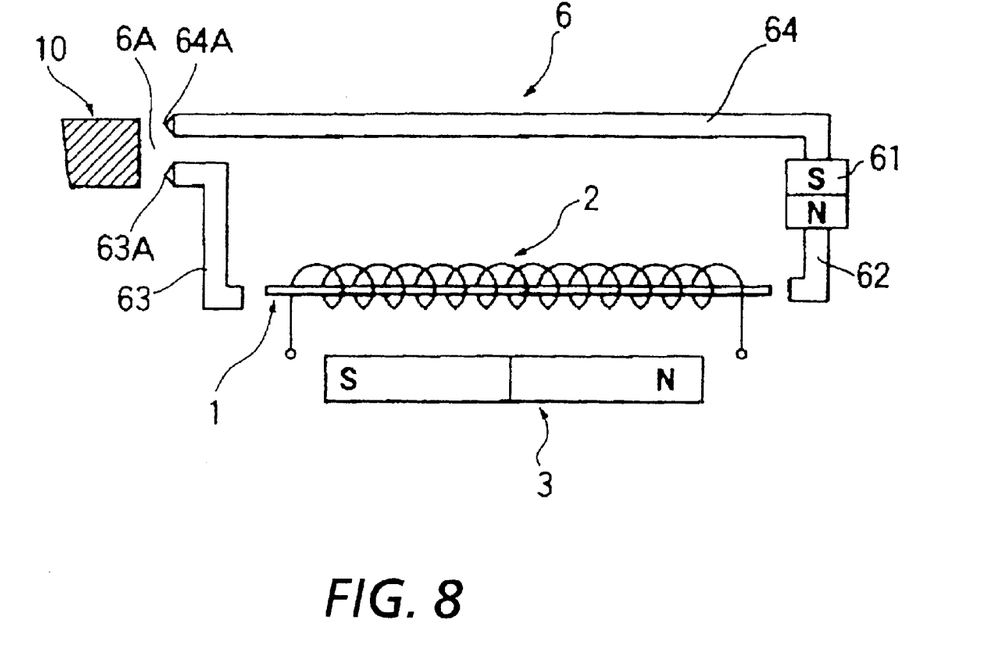
FIG. 8 is a schematic diagram showing a pulse signal generator according to still another embodiment of the invention.

FIG. 8 shows a third embodiment of a pulse signal generator. The pulse signal generator is identical with that of FIG. 1 except for the magnetic circuit forming member 6. The magnetic circuit forming member 6 consists of a permanent magnet 61, a first magnetic piece 62 provided between a magnetic pole of the permanent magnet 61 and an end of the magnetic element 1, a second magnetic piece 63 provided between the other end of the magnetic element 1 and the detection area where it faces the object to be detected 10, and a third magnetic piece 64 provided between the other magnetic pole of the permanent magnet 61 and the detection area where it faces the object to be detected. The detection area is a magnetic path 6A between the end 63A of the magnetic piece 63 and the end 64A of the magnetic piece 64.

The first and second magnetic pieces 62 and 63 are spaced from the magnetic element 1 but may be brought into contact with the magnetic element 1. In operation, when the object 10 is not in the vicinity of the detection area 6A, the magnetic resistance (reluctance) of the magnetic path 6A is so high that the main magnetic field of the magnet 61 upon the magnetic element 1 is weak. When the object 10 is in the vicinity of the detection area 6A, the reluctance of the magnetic path 6A is so low that the main magnetic field of the magnet 61 upon the magnetic element 1 is strong. Thus, a large Barkhausen jump takes place in the magnetic element 1.

The magnetic flux of the main magnet 61 in FIG. 8 concentrates on the magnetic element 1 more than those of FIGS. 1 and 4 so that it is possible to provide a device which is more sensitive but more resistant against noise. A pulse is generated by the presence of the object to be detected.

Alternatively, the biasing magnet and the main magnet may be electromagnets. The detection coil may be replaced by a Hall element, MR element, or resonator circuit.

The very low speed of a straight or rotary movement may be detected. The resulting pulse signal keeps a constant voltage and phase relationship so that it does not go down below the noise level, thus eliminating the need for a limiter.

The resolution is so high that accurate timing is obtained.

The magnetic flux of the main magnet is made to concentrate on the magnetic element so that the device is sensitive but resistant against noise.

The object to be detected is made from a magnetic material so that no separate movable body is required. Also, it is possible to employ no power source and it is easy to provide an explosion-proof device.

The magnetic path can be changed corresponding to the size and shape of the object to be detected so that there is a large degree of freedom to design the device. The device is so compact that it can replace the conventional pickup or Hall effect sensor.

As described above, the device can find more applications than the conventional electromagnetic pickup and Hall effect sensor. For example, it can be used for the detection of r.p.m. and angle of an automobile engine, automobile ABS, motor, crank shaft, acceleration sensor, such as an air bag sensor, PC keyboard, plugging detection of HID lamps, vibration sensor, swing sensor, and door open/close sensor.

What is claimed is:

1. A method for generating a pulse signal with a magnetic element capable of causing a large Barkhausen jump, comprising the steps of:
    applying to said magnetic element a magnetic field for causing a predetermined magnetization of said magnetic element; and
    providing a magnetic circuit forming member for forming a magnetic circuit via an object made of a magnetic substance to be detected to change said magnetic field upon said magnetic element in response to movement of said object, thereby causing a large Barkhausen jump in said magnetic element to provide a pulse signal.

2. A method for generating a pulse signal with a magnetic element capable of causing a large Barkhausen jump, comprising the steps of:
    applying to said magnetic element a magnetic field for causing a predetermined magnetization of said magnetic element; and
    providing a magnetic circuit forming member stationary with respect to said magnetic element for changing said magnetic field upon said magnetic element in response to movement of an object made of a magnetic substance, thereby causing a large Barkhausen jump in said magnetic element to provide a pulse signal.

3. A pulse signal generator, comprising:
    a magnetic element capable of causing a large Barkhausen jump;
    a detector provided in relation to said magnetic element;
    a magnetic field generating means provided in vicinity of said magnetic element for applying a biasing magnetic field which causes a predetermined magnetization of said magnetic element;
    magnetic circuit forming means provided in vicinity of said magnetic element for producing a main magnetic field which causes a large Barkhausen jump in said magnetic element; and
    said magnetic circuit forming means forming a magnetic circuit via an object made of a magnetic substance to be detected and having a magnetic path such that said main magnetic field is changed by change of reluctance of said magnetic path caused by movement of said object, thus causing a large Barkhausen jump in said magnetic element.

4. A pulse signal generator, comprising:
    a magnetic element capable of causing a large Barkhausen jump;
    a detector provided in relation to said magnetic element;
    a magnetic field generating means provided in vicinity of said magnetic element for applying a biasing magnetic field which causes a predetermined magnetization of said magnetic element;
    magnetic circuit forming means provided in vicinity of said magnetic element for producing a main magnetic field which causes a large Barkhausen jump in said magnetic element; and
    said magnetic circuit forming means provided fixedly with respect to said magnetic element and having a magnetic path, reluctance of said magnetic path being changed by an object made of a magnetic substance to be detected so that said main magnetic field is changed by change of said reluctance to produce a large Barkhausen jump in said magnetic element.

5. A pulse signal generator according to claim 3 or 4, wherein said magnetic field generating means is a magnet having magnetic poles in vicinity of both ends of said magnetic element.

6. A pulse signal generator according to claim 3 or 4, wherein said magnetic circuit forming means comprises a magnet and a magnetic member provided such that there is a space between a magnetic pole of said magnet and an end of said magnetic member to accommodate said object to be detected.

7. A pulse signal generator according to claim 3 or 4, wherein said magnetic circuit forming means comprises a magnet and a magnetic member having a space for accommodating said object to be detected.

8. A pulse signal generator according to claim 3 or 4, wherein said magnetic circuit forming means is made such that said magnetic element constitutes a magnetic circuit via said object to be detected.

9. A pulse signal generator according to claim 3 or 4, wherein said magnetic circuit forming means comprises a magnet with a pair of magnetic poles between which there is provided a space for accommodating said object to be detected.

10. A pulse signal generator according to claim 3 or 4, wherein said magnetic element is a wire-type element.

11. A pulse signal generator according to claim 3 or 4, wherein said detector comprises a detection coil provided around said magnetic element.

12. A pulse signal generator according to claim 3 or 4, wherein said magnetic element is a film-like element.

13. A pulse signal generator according to claim 3 or 4, wherein said magnetic element is a plate-like element.

14. A pulse signal generator according to claim 12, wherein said detector comprises a flat detection coil provided in vicinity of said magnetic element.

15. A pulse signal generator according to claim 13, wherein said detector comprises a flat detection coil provided in vicinity of said magnetic element.

* * * * *